(12) United States Patent
Hurley

(10) Patent No.: US 7,262,681 B2
(45) Date of Patent: Aug. 28, 2007

(54) INTEGRATED SEMICONDUCTOR INDUCTOR AND METHOD THEREFOR

(75) Inventor: Ryan J. Hurley, Gilbert, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 56 days.

(21) Appl. No.: 11/055,638

(22) Filed: Feb. 11, 2005

(65) Prior Publication Data

US 2006/0181385 A1    Aug. 17, 2006

(51) Int. Cl.
*H01F 5/00* (2006.01)
*H01F 7/06* (2006.01)

(52) U.S. Cl. ............... 336/200; 336/232; 29/602.1

(58) Field of Classification Search .......... 336/200, 336/223, 232; 29/602.1
See application file for complete search history.

(56) References Cited

U.S. PATENT DOCUMENTS 5,095,357 A * 3/1992 Andoh et al. ............... 257/379
5,831,331 A * 11/1998 Lee ............................. 257/659
6,429,504 B1 * 8/2002 Beaussart et al. ........... 257/531
6,486,529 B2 * 11/2002 Chi et al. .................... 257/531
2003/0228848 A1   12/2003 Escoffier et al.

OTHER PUBLICATIONS

Data Sheet, California Micro Devices Corp, "LCD & Camera EMI Filter Array with ESD Protection, Preliminary MC1450", 8 pages, Copyright 2005.
Data Sheet, California Micro Devices Corp, "LCD & Camera EMI Filter Array with ESD Protection, Preliminary MC1451", 8 pages, Copyright 2005.
Data Sheet, Semiconductor Components Industries, LLC, "NUF6106FCT1, 6 Channel EMI Pi-Filter Array with ESD Protection", Mar. 2004, Rev.0, 4 pages, Copyright 2004.
"Integrated Multilayer RF Passives in Silicon Technology", by Joachim N. Burghartz, 0-7803-5288-2/98, Copyright 1998 IEEE, pp. 141-147.

* cited by examiner

*Primary Examiner*—Anh Mai
(74) *Attorney, Agent, or Firm*—Robert F. Hightower

(57) ABSTRACT

In one embodiment, a multi-layer inductor is formed overlying a semiconductor substrate.

16 Claims, 3 Drawing Sheets

INTEGRATED SEMICONDUCTOR INDUCTOR AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to integrate filters onto monolithic semiconductor devices. Typically such filters were limited to simple pi-type filters that included resistive and capacitive elements or in some cases inductive and passive elements. One example of a pi-type filter was the NUF6106 sold by ON Semiconductor of 5005 East McDowell Road, Phoenix Ariz. The pi-type filters often did not provide sufficient attenuation above the cut-off frequency of the filter. The filters that included inductors typically were pi-type filters with a series inductor coupled in series with the pi-type filter. One example of such a filter is disclosed in U.S. patent application publication number U.S. 2003/0228848. Inductive filters typically had excessive loss at frequencies above the cut-off frequency of the filter (typically referred to as insertion loss), and often had undesirable group delay distortion.

Accordingly, it is desirable to have a filter integrated onto a monolithic semiconductor device that as low group delay distortion, low insertion loss below the cut-off frequency, and high loss above the cut-off frequency.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
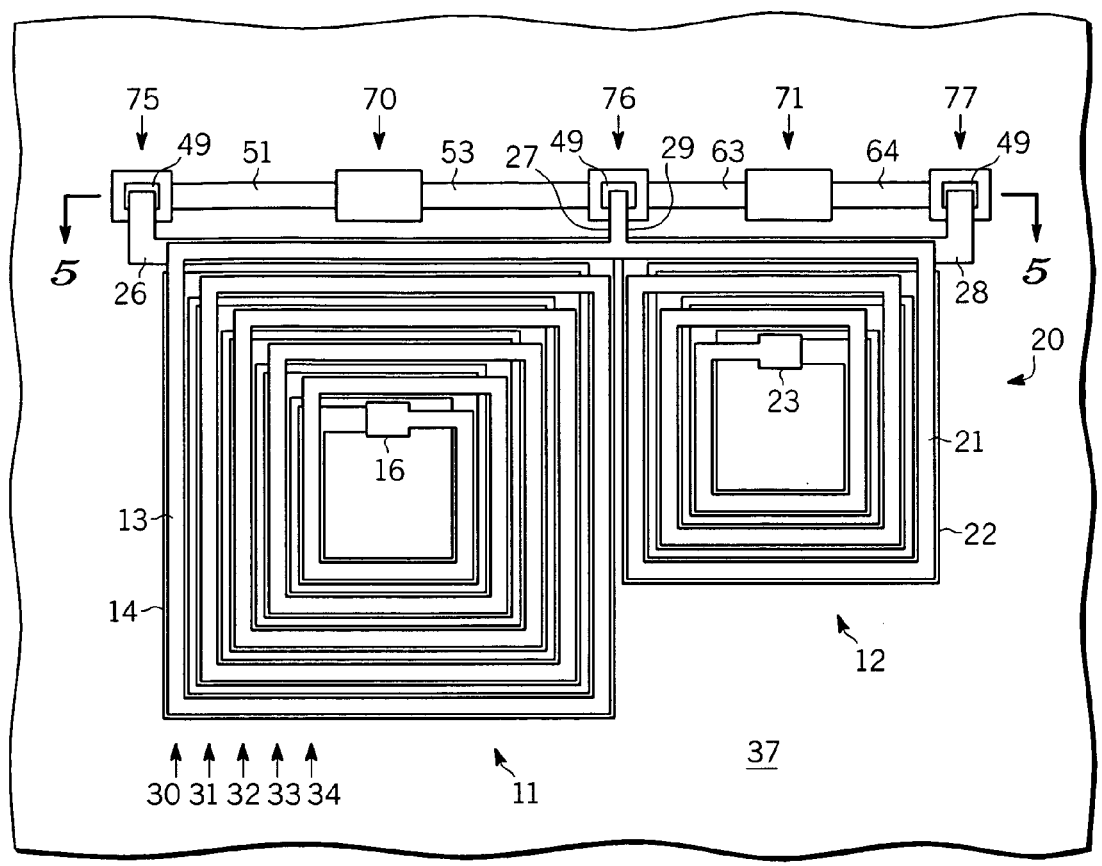
FIG. 1 illustrates an enlarged plan view of a portion of an embodiment of a filter integrated onto semiconductor device in accordance with the present invention.

FIG. 1 schematically illustrates an enlarged plan view of a portion of an embodiment of a semiconductor device 10 that includes a fifth order Bessel filter 20 integrated onto a semiconductor substrate 37. Filter 20 is identified in a general manner by an arrow. As will be seen further hereinafter, the elements of filter 20 facilitate forming resonant structures. Filter 20 includes a first stacked or multi-layer inductor 11 and a second stacked or multi-layer inductor 12 that are used as the inductors of filter 20. As will be understood by those skilled in the art, integrated semiconductor inductors such as inductor 11 or inductor 12 or the combination thereof may be used to form other types of filters in addition to the fifth order Bessel filter of filter 20 including band pass, Chebyschev, and elliptic filters. Filter 20 also includes a first transient voltage suppression device (TVS) 75, a first capacitor 70, a second transient voltage suppression device (TVS) 76, a second capacitor 71, and a third transient voltage suppression device (TVS) 77.

Figure 2:
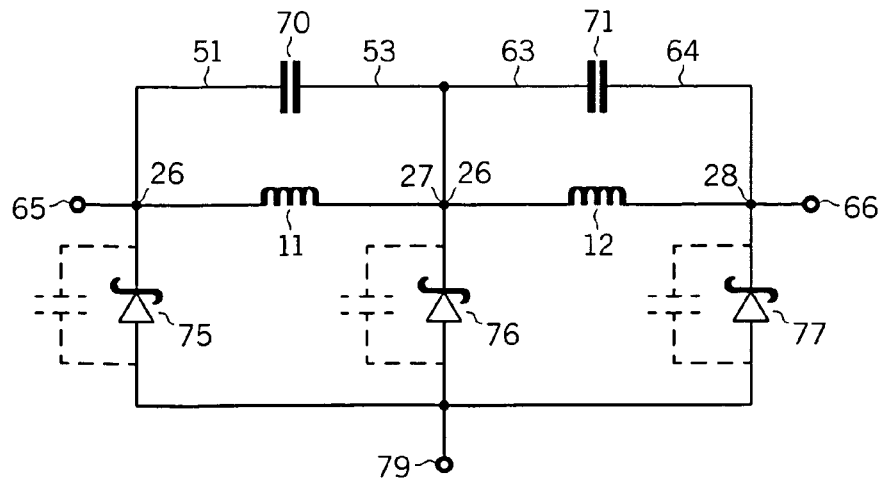
FIG. 2 schematically illustrates a portion of an embodiment of a circuit representation of the filter of FIG. 1 in accordance with the present invention.

FIG. 2 schematically illustrates a portion of an embodiment of a circuit 45 that represents filter 20 of FIG. 1. This description has references to both FIG. 1 and FIG. 2. Inductor 11 is coupled in parallel with capacitor 70 to form a first resonant circuit on substrate 37. Inductor 12 is coupled in parallel with capacitor 71 to form a second resonant circuit on substrate 37. TVS 75 is connected between a first terminal 26 of inductor 11 and a common return terminal 79. TVS 75 functions as a third capacitor, illustrated by dashed lines, of filter 20. TVS 76 is connected between terminal 79 and a common connection to a second terminal 27 of inductor 11 and a first terminal 29 of inductor 12. TVS 76 functions as a fourth capacitor, illustrated by dashed lines, of filter 20. TVS 77 is connected between a second terminal 28 of inductor 12 and terminal 79 to function as a fifth capacitor, illustrated by dashed lines, of filter 20. Those skilled in the art appreciate that TVS 75, 76, and 77 may also provide electro-static discharge protection for other elements or circuits that may be connected to filter 20.

Figure 3:
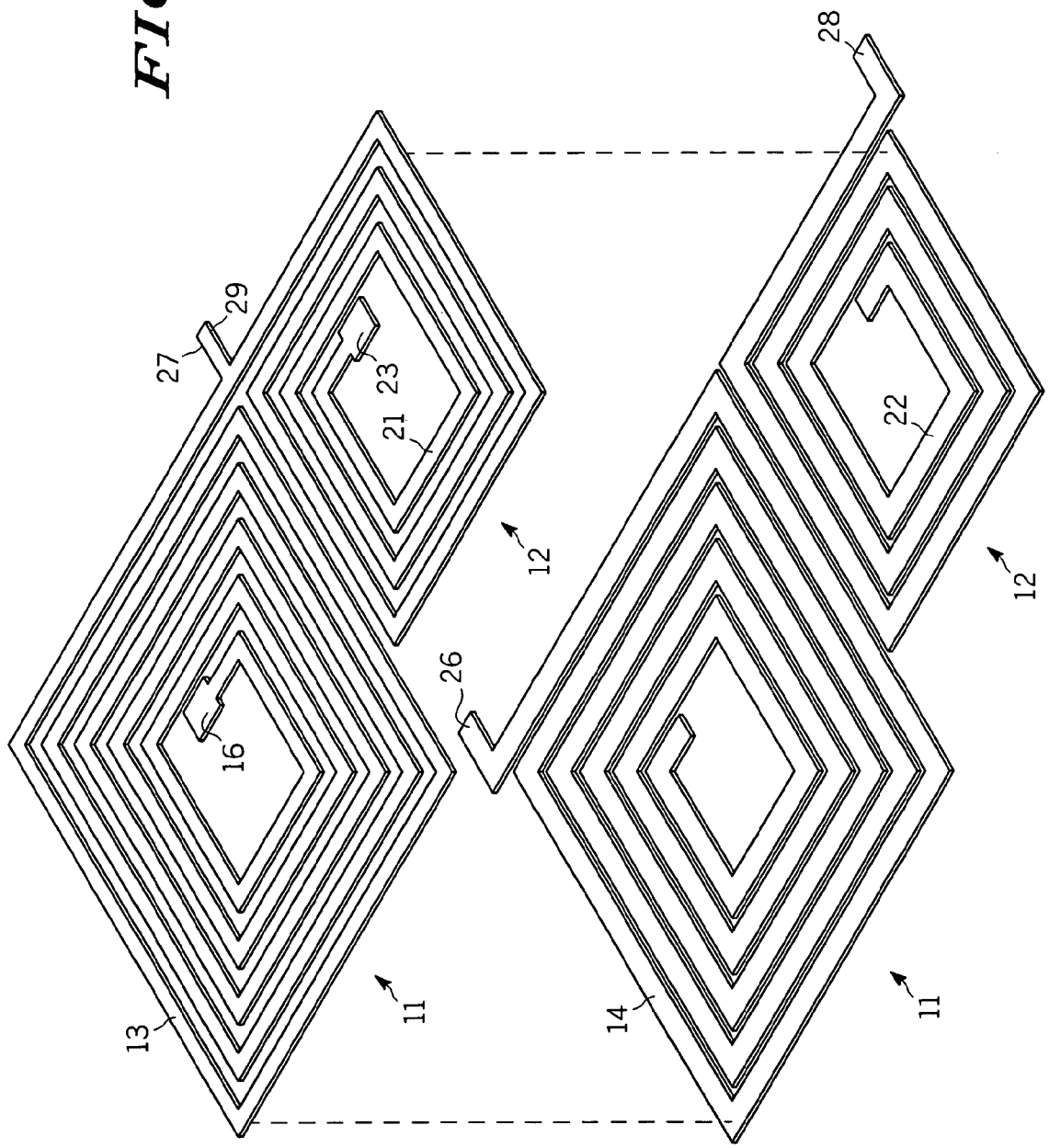
FIG. 3 illustrates an exploded view of a portion of the filter of FIG. 1 in accordance with the present invention.

FIG. 3 illustrates an enlarged exploded view of a portion of inductors 11 and 12 of FIG. 1.

Figure 4:
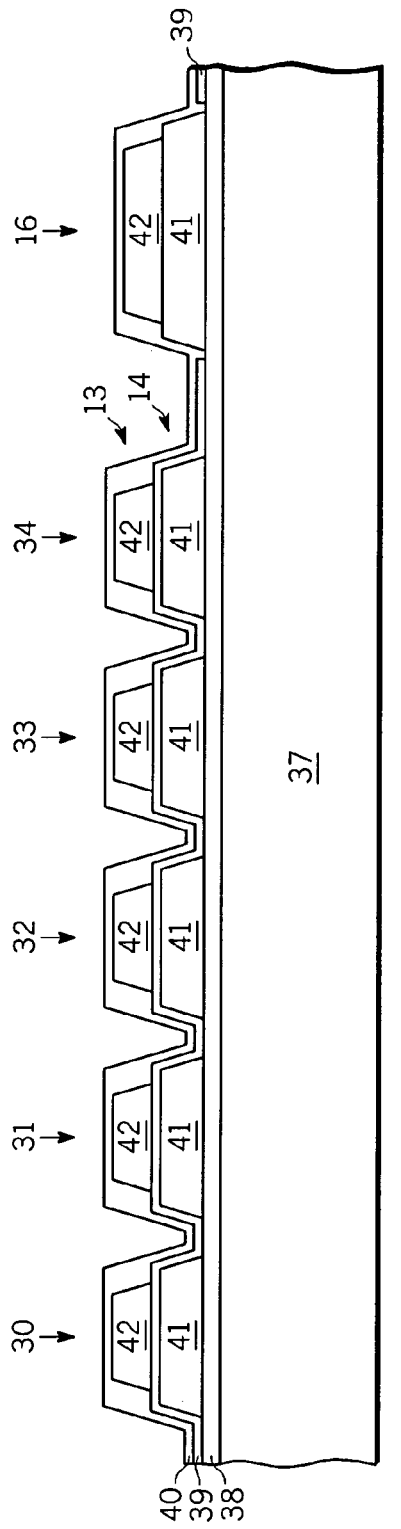
FIG. 4 illustrates an enlarged cross-sectional view of a portion of the filter of FIG. 1 accordance with the present invention.

FIG. 4 illustrates, in a general way, an enlarged cross-sectional view of a portion of inductor 11. The cross-section is illustrated to cut through legs 30, 31, 32, 33, and 34 of inductor 11. This description has references to FIG. 1, FIG. 2, FIG. 3, and FIG. 4. Inductor 11 is formed to include a first inductor element 14 and a second inductor element 13. First inductor element 14 is formed to overlie a first portion of a surface of substrate 37 and second inductor element 13 is formed overlying element 14. Element 14 is formed in a pattern that provides electro-magnetic coupling between adjacent portions of element 14 in order to provide element 14 an inductance that is greater than the inductance of a straight line conductor. Element 13 is formed in a similar pattern overlying element 14 such that the pattern of element 13 provides electro-magnetic coupling between adjacent portions of element 13 in order to provide element 13 an inductance that is greater than the inductance of a straight line conductor. Thus, elements 13 and 14 are magnetically coupled to each other. Additionally the pattern and the overlying proximity of elements 14 and 13 provide electro-magnetic coupling between elements 13 and 14 such that elements 13 and 14 form an inductance for inductor 11 that is greater than the sum of the separate inductance of element 13 plus the separate inductance of element 14. Typically, adjacent portions of element 14 are about one to six (1-6) microns apart and adjacent portions of element 13 are about two to ten (2-10) microns apart. Element 13 typically is about one-half to two (0.5-2) microns from element 14 in order to ensure that there is sufficient coupling therebetween.

One end or terminal of element 13 is electrically connected to one end or terminal of element 14 at a node 16 in order to provide an electrical connection between elements 13 and 14. A second terminal of element 14 functions as terminal 26 of inductor 11 and a second terminal of element 13 functions as terminal 27 of inductor 11.

Inductor 12 is formed to include a first inductor element 22 and a second inductor element 21. First inductor element 22 is formed to overlie a second portion of the surface of substrate 37 and second inductor element 21 is formed overlying element 22. Element 22 is formed in a pattern that provides electromagnetic coupling between adjacent portions of element 22 in order to provide element 22 an inductance that is greater than the inductance of a straight line conductor. Element 21 is formed in a similar pattern overlying element 22 such that the pattern of element 21 provides electro-magnetic coupling between adjacent portions of element 21 in order to provide element 21 an inductance that is greater than the inductance of a straight line conductor. Additionally the pattern and the overlying proximity of elements 22 and 21 provide electro-magnetic coupling between elements 22 and 21 such that elements 22 and 21 form an inductance for inductor 12 that is greater than the sum of the separate inductance of element 21 plus the separate inductance of element 22. One end or terminal of element 21 is electrically connected to one end or terminal of element 22 at a node 23 in order to provide an electrical connection between elements 22 and 21. A second terminal of element 22 functions as terminal 28 of inductor 12 and a second terminal of element 22 functions as terminal 29 of inductor 12.

In the preferred embodiment, elements 13 and 14 are formed in the shape of a square spiral. However, each of elements 13 and 14 may be formed in other shapes that provide mutual magnetic flux coupling between adjacent portions of element 13 and that provides mutual flux coupling between adjacent portions of element 14, and between elements 13 and 14. For example, elements 13 and 14 may be formed in a circular spiral, or an elongated spiral, or any well known shapes that provide magnetic flux coupling. In this preferred embodiment, element 14 begins at node 16 and extends in a counter-clockwise direction above the surface of substrate 37 until terminating in terminal 26. Element 13 begins at node 16 and extends in a clock wise direction overlying portions of element 14 that have substantially the same radius as the corresponding portion of element 13 until terminating at terminal 27. Inductor 12 is formed similarly to inductor 11. Element 22 begins at node 23 and extends in a clockwise direction above the surface of substrate 37 until terminating at terminal 28. Element 21 begins at node 23 and extends in a counterclockwise direction overlying similar portions of element 22 until terminating at terminal 29. The exploded view in FIG. 2 assists in illustrating the overlying relationships between elements 13 and 14 and elements 21 and 22.

Referring to FIG. 1 and FIG. 4, element 14 typically includes a conductor 41 and an overlying dielectric 39. Element 13 typically includes a conductor 42 and an overlying dielectric 40. Typically, conductors 41 and 42 are formed from low resistance conductor materials such as metals in order to minimize the series resistance. The material used for conductors 41 and 42 typically has a resistivity that is no greater than about four to five (4-5) micro ohm-cm. Elements 13 and 14 typically are formed overlying the first portion of substrate 37. A dielectric 38 typically is formed on a surface of substrate 37 in order to electrically insulate inductor 11 from substrate 37. Conductor 41 is formed on the surface of dielectric 38 in the desired pattern of element 14. For example, a mask may be applied to dielectric 38 and patterned to expose the portions of dielectric 38 where conductor 41 is to be formed. Thereafter, dielectric 39 is formed overlying conductor 41. Dielectric 39 may not be formed on the portion of conductor 41 where node 16 is formed. Conductor 42 is formed on the surface of dielectric 39 that is overlying the top surface of conductor 41. Conductor 42 is also formed on the surface of conductor 41 where node 16 is formed. A dielectric 40 typically is applied to cover conductor 42 to electrically insulate conductor 42 from other elements of device 10.

Inductor 12 is formed in a manner similar to inductor 11. Element 22 includes a conductor similar to conductor 41 and an overlying dielectric similar to dielectric 39. Element 21 includes a conductor similar to conductor 42 and overlying dielectric similar to dielectric 40. Node 23 is formed in a manner similar to node 16.

It should be noted that in order to illustrate elements 13, 14, 21, and 22 in FIG. 1 and FIG. 2, the edges of dielectric layer 40 that may obscure underlying elements 14 and 22 may not be shown in FIG. 1 and FIG. 2 for clarity of the description.

Figure 5:
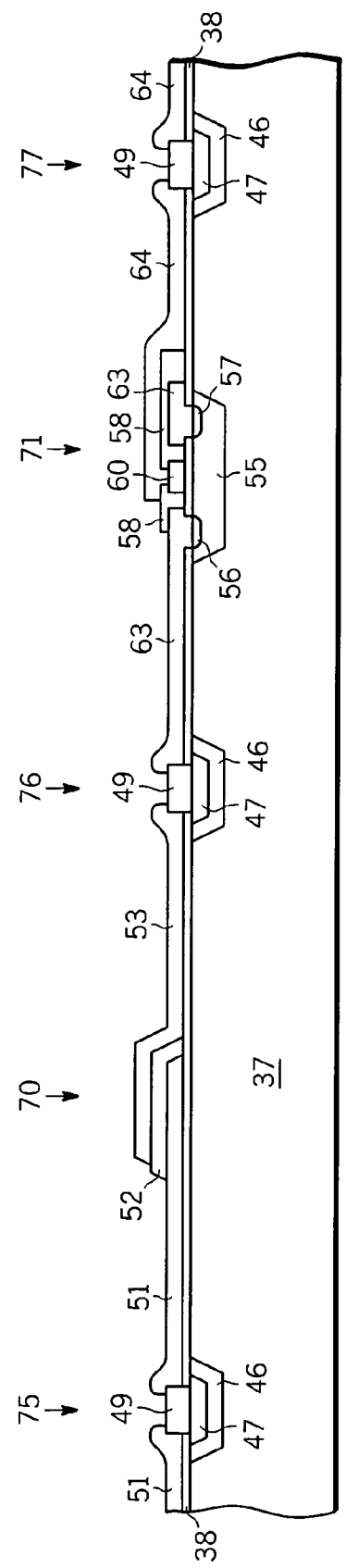
FIG. 5 illustrates and enlarged cross-sectional view of another portion of the filter of FIG. 1 in accordance with the present invention.

Referring to FIG. 1 and FIG. 5, TVS 75, TVS 76, and TVS 77 are formed on the surface of substrate 37. Typically, TVS 75, TVS 76, and TVS 77 are each formed by forming a first doped region 46 on the surface of substrate 37. A second doped region 47 is formed within doped region 46 in order to form a contact region for each of TVS 75, 76, and 77. Dielectric 38 may be formed prior to regions 46 and 47 or may be formed after forming regions 46 and 47. A conductor 49 is applied to form electrical contact to region 47. Conductor 49 of TVS 75 and 77 typically are extended across dielectric 38 to make electrical contact to respective terminals 26 and 28 of respective inductors 11 and 12. Conductor 42 of inductor 11 and the corresponding conductor of inductor 12 may extend to make electrical contact with conductor 49 of TVS 76 thereby connecting terminals 27 and 29 to TVS 76. Those skilled in the art will realize that substrate 37 functions as terminal 79 of FIG. 2.

Capacitors 70 and 71 may be planar capacitors formed overlying the surface of substrate 37 or may be formed as metal oxide semiconductor (MOS) capacitors on the surface of substrate 37 or may be formed as trench capacitors or other well-known capacitor structures. FIG. 5 illustrates in a general manner a planar capacitor that functions as capacitor 70 and an MOS capacitor that functions as capacitor 71. Capacitor 71 includes a doped region 55 that is formed on the surface of substrate 37. A doped region 56 and a doped region 57 are formed within region 55 to function as the source and drain of the MOS transistor that forms capacitor 71. Dielectric 38 may form the gate insulator of the MOS transistor or a different insulator may be formed as the gate insulator. A gate material 60 typically is formed overlying region 55 and disposed between regions 56 and 57 in order to form the gate conductor for capacitor 71. A dielectric 58 usually is formed around material 60 to insulate material 60 from other elements. A conductor 63 may be formed to make electrical contact to regions 56 and 57. Conductor 63 may also extend across dielectric 38 to make electrical contact to conductor 49 of TVS 76. A conductor 64 generally is formed to make electrical contact between material 60 and conductor 49 of TVS 77. As is well known in the art, conductor 63 forms one terminal of capacitor 71 and conductor 64 forms the second terminal of capacitor 64. A conductor 51 may be applied to dielectric 38 to form electrical connection to conductor 49 of TVS 75 and to function as one plate of capacitor 70. A dielectric 52 may be applied to a portion of conductor 51 to form the dielectric of capacitor 70, and another conductor 53 may be applied to overlie at least a portion of dielectric 52 to form a second plate of capacitor 70 and to extend laterally across dielectric 38 to make electrical contact to conductor 49 of TVS 76. Conductors 51, 53, 63, and 64 are illustrated in circuit 45 of FIG. 2.

Referring to FIG. 2, a signal is received on an input 65 of filter 20 and a filtered output signal is formed on an output 66. It is believed that filter 20 reduces insertion loss by about ten decibels (10 db) and reduces group delay distortion by about fifty percent (50%). It is also believed that using an integrated inductor such as inductors 11 or 12 in other filter configurations also improves the insertion loss and group delay distortion.

In view of all of the above, it is evident that a novel device and method is disclosed. Included, among other features, is forming a multilayer inductor on a semiconductor substrate. The multi-layer inductor facilitates forming a capacitor in parallel with the inductor and forming resonate circuits on the semiconductor substrate. The multi-layer inductor provides greater inductance in a given area of a semiconductor die thereby lowering costs. Additionally, other circuit elements may be formed on substrate 37 along with the multi-layer inductor.

While the invention is described with specific preferred embodiments, it is evident that many alternatives and variations will be apparent to those skilled in the semiconductor arts. For example inductor 11 or 12 may be used as a stand alone inductor instead of in a filter circuit, the number of stages and configuration of the stages of filter 20 may be change to form other types of filters. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. An integrated semiconductor inductor comprising:
a semiconductor substrate;
a first multilayer inductor overlying at least a portion of the semiconductor substrate, the first multilayer inductor having a first terminal and a second terminal, the first multilayer inductor also having a first conductor overlying the portion of the semiconductor substrate, a second conductor overlying at least a portion of the first conductor, a first dielectric disposed between the first conductor and the second conductor wherein the first conductor is connected to the first terminal of the first multilayer inductor and the second conductor is connected to the second terminal of the first multilayer inductor; and
a first connection extending through the first dielectric to form electrical contact between the first conductor and the second conductor.

2. The integrated semiconductor inductor of claim 1 wherein the first multilayer inductor has a resistivity no greater than about five micro ohm-cm.

3. The integrated semiconductor inductor of claim 1 wherein a portion of the first multilayer inductor encloses the first connection.

4. The integrated semiconductor inductor of claim 1 wherein the first conductor and the second conductor are metal conductors.

5. The integrated semiconductor inductor of claim 1 further including a first capacitor coupled in parallel with the first multilayer inductor, the first capacitor having a first terminal and a second terminal with the first terminal of the first capacitor coupled to the first terminal of the first multilayer inductor and the second terminal of the first capacitor coupled to the second terminal of the first multilayer inductor.

6. The integrated semiconductor inductor of claim 5 further including a second capacitor having a first terminal coupled to the second terminal of the first multilayer inductor wherein the second capacitor is a transient voltage suppressor.

7. The integrated semiconductor inductor of claim 1 further including a second dielectric overlying the second conductor.

8. The integrated semiconductor inductor of claim 1 further including a second multilayer inductor coupled to the first multilayer inductor.

9. A method of forming an integrated semiconductor inductor comprising:
providing a semiconductor substrate;
forming a first inductor element overlying at least a portion of the semiconductor substrate;
forming a second inductor element overlying at least a portion of the first inductor element wherein the first inductor element is magnetically coupled to the second inductor element and wherein the first inductor element and the second inductor element extend in opposite directions; and
coupling a capacitor in parallel with the first inductor element and the second inductor element.

10. The method of claim 9 wherein forming the second inductor element includes electrically connecting the first inductor element to the second inductor element.

11. The method of claim 9 wherein forming the first inductor element includes forming a first conductor overlying the portion of the semiconductor substrate and forming a first dielectric on at least a portion of a first surface of the first conductor.

12. The method of claim 11 wherein forming the second inductor element includes forming a second conductor on at least a portion of a first surface of the first dielectric and overlying the portion of the first inductor element.

13. An integrated semiconductor filter comprising:
a first multilayer inductor overlying a first portion of a surface of a semiconductor substrate, the first multilayer inductor including a first inductor element extending in a first direction overlying the semiconductor substrate and a second inductor element extending in a different direction overlying the first inductor element wherein an interior terminal end of the first inductor element is connected to an interior terminal end of the second inductor element;
a first capacitor coupled in series with the first inductor; and
a second inductor coupled in series with the first inductor.

14. The integrated semiconductor filter of claim 13 further including a second capacitor coupled in a shunt configuration with the first inductor.

15. The integrated semiconductor filter of claim 14 wherein the second capacitor is a TVS device.

16. The integrated semiconductor filter of claim 13 further including a first dielectric disposed between the fist inductor element and the second inductor element and a second dielectric overlying the second inductor element.

* * * * *